(12) United States Patent
Kasahara et al.

(10) Patent No.: US 6,180,968 B1
(45) Date of Patent: *Jan. 30, 2001

(54) COMPOUND SEMICONDUCTOR DEVICE AND METHOD OF MANUFACTURING THE SAME

(75) Inventors: Kensuke Kasahara; Yasuo Ohno; Satoru Ohkubo, all of Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/866,268

(22) Filed: May 30, 1997

(30) Foreign Application Priority Data

May 31, 1996 (JP) .................................... 8-139064

(51) Int. Cl.[7] .................................... H01L 31/072
(52) U.S. Cl. .................................... 257/192; 257/194
(58) Field of Search .................................... 257/192, 194, 257/195

(56) References Cited

U.S. PATENT DOCUMENTS

| | | | | |
|---|---|---|---|---|
| 5,021,857 | * | 6/1991 | Suehiro | 357/42 |
| 5,041,891 | * | 8/1991 | Ishii | 357/37 |
| 5,888,860 | * | 3/1999 | Kohno | 438/180 |

FOREIGN PATENT DOCUMENTS 4-137737  5/1992  (JP) .

* cited by examiner

Primary Examiner—Sara Crane
(74) Attorney, Agent, or Firm—Sughrue, Mion, Zinn, Macpeak & Seas, PLLC

(57) ABSTRACT

There are provided a compound semiconductor device having a semiconductor multilayered structure, and a method of manufacturing the same. The semiconductor multilayered structure consists of a first recess etching stopper formed on a conductive layer of a compound semiconductor, a first semiconductor layer formed on the first recess etching stopper layer, a second recess etching stopper layer formed on the first semiconductor layer, and a second semiconductor layer formed on the second recess etching stopper layer.

8 Claims, 3 Drawing Sheets

COMPOUND SEMICONDUCTOR DEVICE AND METHOD OF MANUFACTURING THE SAME

BACKGROUND OF THE INVENTION

1. Field of the Invention

The present invention relates to a compound semiconductor device and a method of manufacturing the same and, more particularly, to a field effect transistor having a multilevel recess structure and a method of manufacturing the same.

2. Description of the Prior Art

When an LDD structure is to be realized with an HJFET in order to attain a higher gate breakdown voltage, a lower source resistance, and suppression of the short channel effect and the surface effect, a multilevel recess structure must be formed by performing recess etching in two stages upon two alignment processes in a conventional case. In Japanese Unexamined Patent Publication No. 4-137737, a multilayered mask is used to selectively side-etch the mask, thereby realizing a two-level recess structure with improved controllability in the lateral direction.

When a two-level recess is formed using two alignment processes, misalignment disadvantageously occurs, and the distance between the gate and the $n^+$ region is difficult to control and shorten. Even if the controllability in the lateral direction is improved using a multilayered mask, as disclosed in Japanese Unexamined Patent Publication No. 4-137737, etching also progresses along the lateral direction in recess etching, and a short gate and control of the recess width cannot be attained.

As for the direction of depth in recess etching, the recess depths at the first and second levels are controlled in terms of time, resulting in poor reproducibility, low controllability, and low uniformity.

SUMMARY OF THE INVENTION

The present invention has been made in consideration of the above situation in the prior art, and has as its object to provide a compound semiconductor device which can be manufactured while precisely controlling the recess width and depth.

To achieve the above object, according to the basic aspect of the present invention, there is provided a compound semiconductor device comprising a semiconductor multilayered structure, wherein the semiconductor multilayered structure consists of a first recess etching stopper formed on a conductive layer of a compound semiconductor, a first semiconductor layer formed on the first recess etching stopper layer, a second recess etching stopper layer formed on the first semiconductor layer, and a second semiconductor layer formed on the second recess etching stopper layer.

According to the present invention, the first and second semiconductor layers defined in the basic aspect may consist of a compound semiconductor selected from the group consisting of GaAs, InAs, $Al_xGa_{1-x}As$ ($0 \leq x < 1$), $Al_yIn_{1-y}As$ ($0 \leq y < 1$), InP, GaP, and compounds thereof.

According to the present invention, the first and second etching stopper layers defined in the basic aspect may consist of a material selected from the group consisting of AlAs, $Al_zGa_{1-z}As$ ($0 < z \leq 1$) having an Al composition higher than that of $Al_xGa_{1-x}As$, and $Al_wIn_{1-w}As$ ($0 < w \leq 1$) having an Al composition higher than that of $Al_yIn_{1-y}As$.

Further, according to the present invention, the semiconductor multilayered structure defined in the basic aspect has a gate parallel to a [011] direction.

To achieve the above object, according to another basic aspect of the present invention, there is provided a method of manufacturing a compound semiconductor device with a semiconductor multilayered structure, comprising the mask formation step, the patterning step, the first anisotropic etching step, and the second anisotropic etching step, wherein the semiconductor multilayered structure has a first recess etching stopper layer formed on a conductive layer of a compound semiconductor, a first semiconductor layer formed on the first recess etching stopper layer, a second recess etching stopper layer formed on the first semiconductor layer, and a second semiconductor layer formed on the second recess etching stopper layer, the mask formation step is the process of forming first and second mask layers having different etching rates on the semiconductor multilayered structure, the patterning step is the process of patterning the second mask layer and patterning the first mask layer using the patterned second mask, the first anisotropic etching step is the process of anisotropically etching the second semiconductor layer to the second recess etching stopper by using the first and second mask layers, and the second anisotropic etching step is the process of removing the second recess etching stopper layer at an opening portion, selectively increasing an opening width of the first mask layer by side etching, and then anisotropically etching the second and first semiconductor layers to the second and first recess etching stopper layers, respectively.

The first and second semiconductor layers defined in the basic aspect of the manufacturing method are anisotropically etched by using, as an etching solution, a solution mixture of an aqueous citric acid solution and a hydrogen peroxide solution.

As is apparent from the above aspects, in the present invention, first and second mask layers having different etching rates are formed on a semiconductor multilayered structure. The second mask layer is patterned, and the first mask layer is patterned using the patterned second mask layer. The second semiconductor layer is anisotropically etched to the second recess etching stopper layer by using the first and second mask layers.

In anisotropic etching to the second recess etching stopper layer, a solution mixture of an aqueous citric acid solution and a hydrogen peroxide solution is used as an etching solution. The citric acid-based etching solution can selectively etch a semiconductor layer formed of, e.g., GaAs and a stopper layer formed of, e.g., AlAs, and its etching rate for a (111) B plane can be suppressed very small. If this citric acid-based etching solution is used for etching the semiconductor multilayered structure, etching can be stopped at the (111) B plane without any side etching in the lateral direction and at the second recess etching stopper layer in the direction of depth.

By using the above-described etching method, the depth and opening width at the first level are determined by the position of the second recess etching stopper layer and the opening dimension of the second mask layer almost independently of the etching time.

Since the opening shape is rate-determined by the (111) B plane by forming the gate parallel to the [011] direction, the opening at the second level can be made smaller than the opening dimension of the second mask layer.

The second recess etching stopper layer is removed at the opening portion. After the opening width of the first mask layer is selectively increased by side etching, the second and first semiconductor layers are anisotropically etched again to the second and first recess etching stopper layers with a citric acid-based etching solution.

Since the second semiconductor layer is etched only at the opening portion due to the presence of the second recess etching stopper layer, a two-level recess structure can be easily formed. The opening width at the second level is already determined by the initial recess width at the first level. By forming the gate parallel to the [011] direction, the opening width decreased upon recess etching at the first level is further decreased upon etching at the second level.

The carrier density of the first semiconductor layer is set lower than that of the second semiconductor layer. The gate electrode is short-circuited with the first semiconductor layer, and is spaced apart from the heavily doped second semiconductor layer. With this arrangement, a high drain breakdown voltage can be attained while surface influences such as a gate lag are avoided. This structure can be easily fabricated in self-alignment. The recess width at the second level in the lateral direction is determined by the initial mask opening width and the thicknesses of the first and second semiconductor layers. The etching depth is determined by the position of the stopper layer. The recess width at the first level can be controlled by the side etching amount of the first mask layer, and the depth is determined by the stopper layer. For this reason, the controllability, uniformity, and reproducibility of a threshold voltage Vt are improved. When the gate is formed parallel to the [011] direction, the channel (gate) can be easily made shorter than the mask opening dimension by an amount controlled by the thicknesses of the first and second semiconductor layers, resulting in an improvement in device characteristics.

As described above, according to the present invention, etching can be stopped at the (111) B plane defined by the mask without any side etching in the lateral direction. The etching depth is determined by the stopper layer. Therefore, the device can be fabricated almost independently of the etching time. The controllability, uniformity, and reproducibility of the threshold voltage Vt can also be improved. Further, since the wet process is employed, the process facilities are simple, and the cost can also be reduced.

As for the device characteristics, since the gate electrode and the lightly doped semiconductor layer can be short-circuited or the distance therebetween can be decreased with high controllability, surface influences such as a gate lag can be avoided in the semiconductor device.

In addition, the distance between the gate electrode and the heavily doped semiconductor layer depends on the width and thickness of the mask layer, and recesses at two levels can be easily formed with high controllability. Therefore, the source resistance can be reduced while keeping a high drain breakdown voltage.

The above and many other objects, features and advantages of the present invention will become manifest to those skilled in the art upon making reference to the following detailed description and accompanying drawings in which preferred embodiments incorporating the principles of the present invention are shown by way of illustrative example.

DETAILED DESCRIPTION OF PREFERRED EMBODIMENT

A heterojunction field effect transistor according to an embodiments of the present invention will be described below with reference to the accompanying drawings (FIGS. 1A to 1L).

Figure 1A:
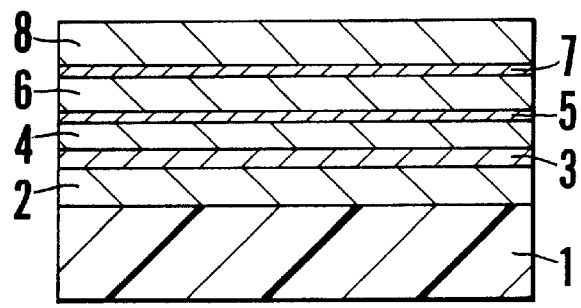
FIGS. 1A to 1L are sectional views, respectively, showing the steps in a semiconductor device manufacturing method according to an embodiment of the present invention.

As shown in FIG. 1A, a 500-nm i-GaAs buffer layer 2, a 15-nm i-InGaAs layer serving as a channel layer 3, and a 33-nm n-AlGaAs layer 4 having a carrier concentration of $2 \times 10^{18}$ cm$^{-3}$ are formed on a semi-insulating GaAs substrate 1 by, e.g., MOCVD from the substrate side. A 2-nm n-AlAs layer having a carrier concentration of $2 \times 10^{18}$ cm$^{-3}$ is formed as a first recess etching stopper layer 5 on the resultant structure. A 150-nm lightly doped n-GaAs layer having a carrier concentration of $1 \times 10^{18}$ cm$^{-3}$ is formed as a first semiconductor layer 6 on the first recess etching stopper layer 5. A 2-nm n-AlAs layer having a carrier concentration of $2 \times 10^{18}$ cm$^{-3}$ is formed as a second recess etching stopper layer 7 on the n-GaAs layer 6. A 50-nm heavily doped n-GaAs layer having a carrier concentration of $4 \times 10^{18}$ cm$^{-3}$ is formed as a second semiconductor layer 8 on the second recess etching stopper layer 7. In this manner, the semiconductor multilayered structure of the present invention is fabricated.

Figure 1B:
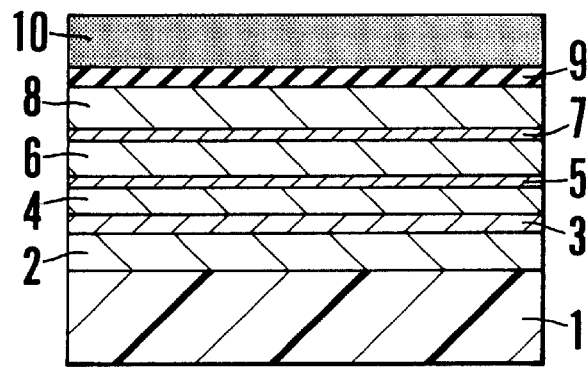

The semiconductor device manufacturing method of the present invention will be described with reference to this compound semiconductor multilayered structure. A 50-nm $SiO_2$ layer is formed as a first mask layer 9 having a different etching rate on the semiconductor multilayered structure, and further a photoresist is formed as a second mask layer 10 (FIG. 1B).

Figure 1C:
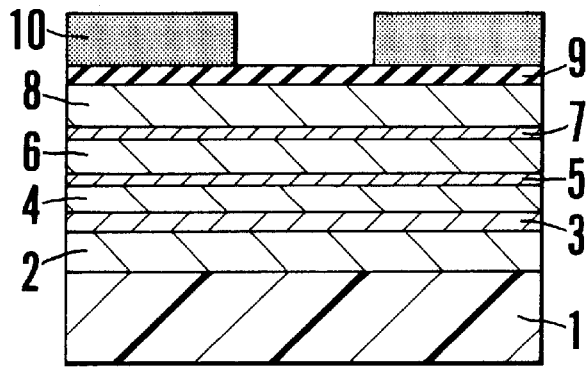
Figure 1D:
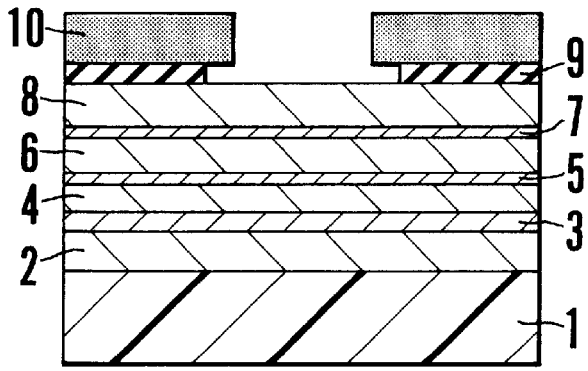

The photoresist serving as the second mask layer 10 is patterned (FIG. 1C). The first $SiO_2$ mask layer 9 is patterned using the patterned second mask layer 10 (FIG. 1D).

Figure 1E:
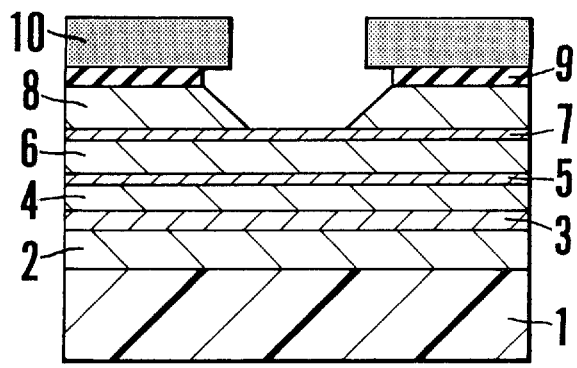

The n-GaAs layer serving as the second semiconductor layer 8 is anisotropically etched to the second AlAs recess etching stopper layer 7 using the first and second mask layers 9 and 10. This etching is performed using, as an etching solution, a solution mixture of an aqueous citric acid solution prepared by dissolving citric acid hydrate in water of the same weight, and a 30%-hydrogen peroxide solution at 3:1 (FIG. 1E).

Figure 1F:
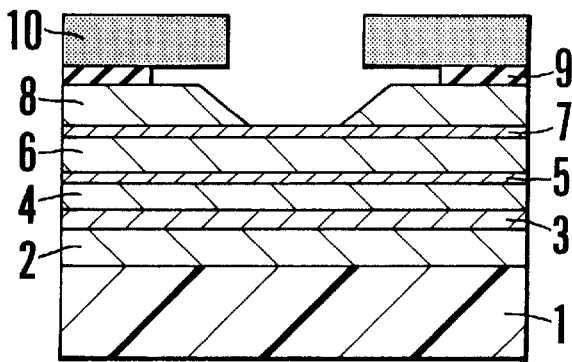
Figure 1G:
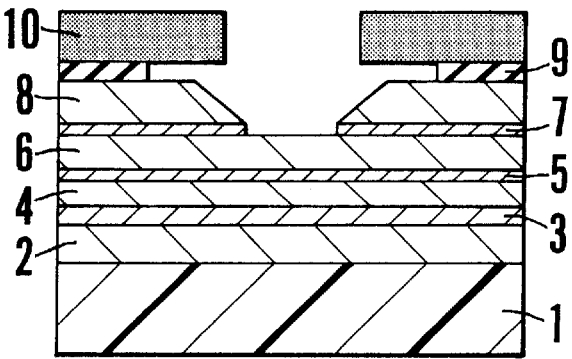
Figure 1H:
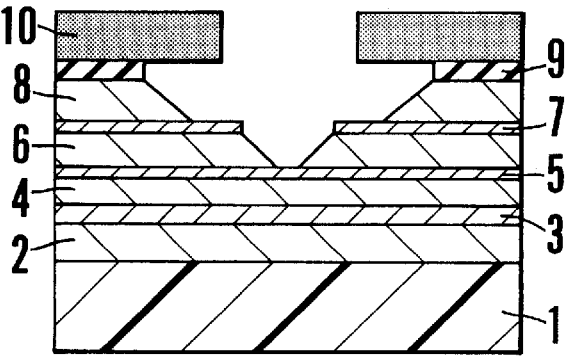

The AlAs layer serving as the second recess etching stopper layer 7 is removed at the opening portion. The opening width of the first $SiO_2$ mask layer 9 is selectively increased by etching in the lateral direction with buffered hydrofluoric acid. The n-GaAs layer serving as the second semiconductor layer 8 and the n-GaAs layer serving as the first semiconductor layer 6 are anisotropically etched again to the second and first recess etching stopper layers 7 and 5 with a citric acid-based etching solution (FIGS. 1F, 1G, and 1H).

Figure 1I:
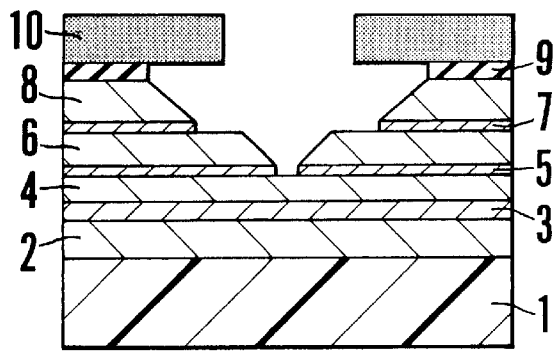
Figure 1J:
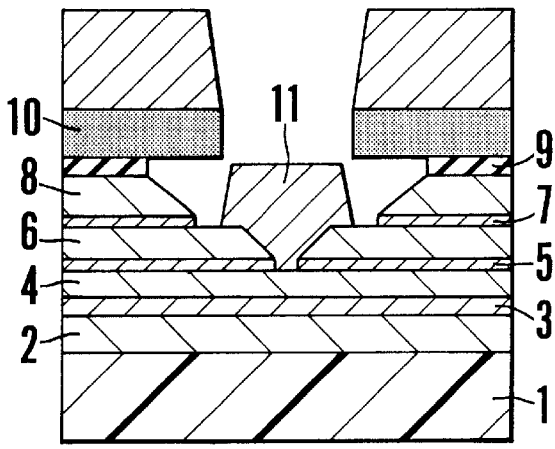
Figure 1K:
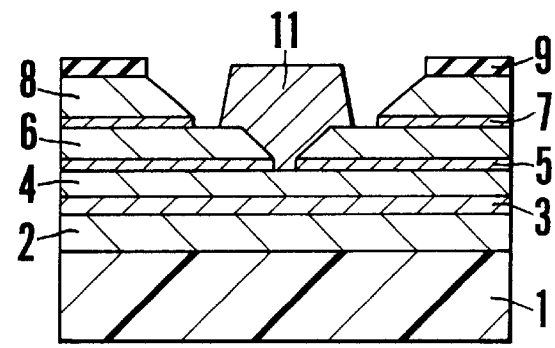
Figure 1L:
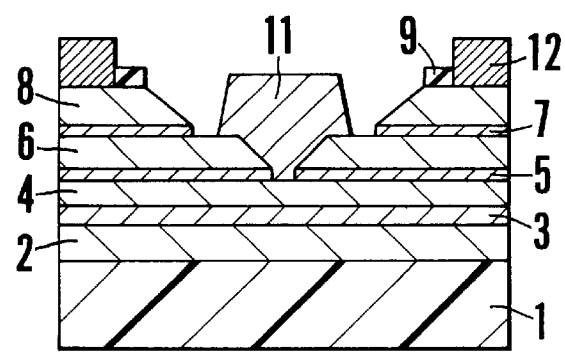

The exposed portions of the first and second recess etching stopper layers 5 and 7 are removed with diluted hydrochloric acid (FIG. 1I). Ti/Pt/At is deposited as a gate metal using the photoresist serving as the first mask layer 9 to form a gate electrode 11 by the lift-off method (FIGS. 1J and 1K). An ohmic electrode 12 with a normal size is formed on the resultant structure to complete a semiconductor device (FIG. 1L).

The citric acid-based etching solution enables selective etching of GaAs and AlGaAs, and its etching rate for the (111) B plane can be suppressed very small at low temperatures. More specifically, the opening width and depth of recess etching at the first level are determined by the opening dimension of the first mask layer upon side etching and the position of the stopper layer, respectively. The opening width and depth at the second level are determined by the opening dimension of the first mask layer before side etching and the position of the stopper layer, respectively. For this reason, etching can be stopped at the (111) B plane defined by the mask without any side etching in the lateral direction. The etching depth is determined by the stopper layer. Therefore, the device can be fabricated almost independently of the etching time.

Since the opening shape in the lateral direction is rate-determined by the (111) B plane, the bottom width upon recess etching becomes larger than the initial mask opening width in accordance with the film thickness by forming the gate parallel to the [011] direction.

In the present invention, the opening width which becomes smaller upon recess etching at the first level than the initial opening width of the second mask layer before side etching becomes still smaller at the opening portion of the AlGaAs electron supply layer upon etching at the second level.

With this arrangement, a short channel can be easily realized to improve the device characteristics. In this embodiment, when the initial opening width of the second mask layer is 0.5 $\mu$m, a 0.22-$\mu$m gate can be formed because the gate is shortened by an inclination amount of 0.14 $\mu$m from each side.

In the semiconductor device fabricated in this manner, the gate electrode 11 and the lightly doped first semiconductor layer 6 can be short-circuited or the distance therebetween can be decreased with high controllability. Therefore, surface influences such as a gate lag can be avoided.

The distance between the gate electrode 11 and the heavily doped second semiconductor layer 8 depends on the opening width and thickness of the first mask layer upon selective etching, and the gate electrode 11 can be formed in self-alignment, so that the distance can be easily controlled. If the distance of the gate electrode 11 with respect to the second semiconductor layer 8 and its carrier concentration are properly set, the source resistance can be reduced while keeping a high drain breakdown voltage.

In the recess formation step, the formation precision in the lateral direction is increased because no side etching is performed. Since the etching depth is determined by the stopper layer, the controllability, uniformity, and reproducibility of the threshold voltage Vt are also improved. Since the wet process is employed, the process facilities are simple, and the cost is also reduced.

In the embodiment of the present invention, although AlAs is used for a stopper layer, the stopper layer may consist of AlGaAs with a composition within the range where etching selectivity with GaAs can be obtained. In this embodiment, the composition ratio of the etching solution is 3:1, but is not limited to this as far as the selectivity and anisotropy can be attained. The etching solution may be added with ammonium citrate or the like as a buffer solution. In addition, although a photoresist and $SiO_2$ are used as mask layers, a mask material capable of selective etching, such as $SiO_2$ and SiON, may be used. As for the material system, although this embodiment exemplifies the AlGaAs/InGaAs/GaAs system, the AlInAs/GaInAs system, the AlInAs/InGaAs/InGaP system, and the like can be employed.

What we claimed is:

1. A compound semiconductor device comprising a semiconductor multilayered structure, said semiconductor multilayered structure comprising;
   a first recess etch-stop layer formed on a conductive layer of a compound semiconductor said first recess etch-stop layer comprising a first etch-stop layer opening;
   a first semiconductor layer formed on said first recess etch-stop layer said first semiconductor layer comprising a first semiconductor layer opening with sloped sidewalls;
   a second recess etch-stop layer formed on said first semiconductor layer said second recess etch-stop layer comprising a second etch-stop layer opening; and
   a second semiconductor layer formed on said second recess etch-stop layer said second semiconductor layer comprising a second semiconductor layer opening with sloped sidewalls;
   wherein said second semiconductor layer is doped more heavily than said first semiconductor layer and a top portion of said second semiconductor layer opening is wider than a lower portion of said second semiconductor layer opening and said lower portion of said second semiconductor layer opening is wider than a top portion of said first semiconductor layer opening and said top portion of said first semiconductor layer opening is wider than a lower portion of said first semiconductor layer opening.

2. A device according to claim 1, wherein said first and second semiconductor layers consist of a compound semiconductor selected from the group consisting of GaAs, InAs, $Al_xGa_{1-x}As$ ($0 \leq x < 1$), $Al_yIn_{1-y}As$ ($0 \leq y < 1$), InP, GaP, and compounds thereof.

3. A device according to claim 1, wherein said first and second etch-stop layers comprise material selected from the group consisting of AlAs, $Al_zGa_{1-z}As$ ($0 < z \leq 1$) and $Al_wIn_{1-w}As$ ($0 < w < 1$) having an Al composition higher than that of said first and second semiconductor layers.

4. A device according to claim 1, wherein said semiconductor multilayered structure has a gate parallel to a direction.

5. A device according to claim 2, wherein said first and second etch-stop layers comprise material selected from the group consisting of AlAs, $Al_zGa_{1-z}As$ ($0 < z \leq 1$) and $Al_wIn_{1-w}As$ ($0 < w < 1$) having an Al composition higher than that of said first and second semiconductor layers.

6. A compound semiconductor device comprising a semiconductor multilayered structure, said semiconductor multilayered structure comprising;
   a buffer layer formed directly on a semi-insulating substrate;
   a channel layer formed directly on said buffer layer;
   a first semiconductor layer formed directly on said channel layer;
   a first recess etch-stop layer formed directly on said first semiconductor layer said first recess etch-stop layer comprising a first etch-stop layer opening;
   a second semiconductor layer formed directly on said first recess etch-stop layer said second semiconductor layer comprising a second semiconductor layer opening;
   a second recess etch-stop layer formed directly on said second semiconductor layer said second recess etch-stop layer comprising a second etch-stop layer opening; and
   a third semiconductor layer formed directly on said second recess etch-stop layer said third semiconductor layer comprising a third semiconductor layer opening,
   wherein said third semiconductor layer is doped more heavily than said second semiconductor layer and a top portion of said third semiconductor layer opening is wider than a lower portion of said third semiconductor layer opening and said lower portion of said third semiconductor layer opening is wider than a top portion of said second semiconductor layer opening and said top portion of said second semiconductor layer opening is wider than a lower portion of said second semiconductor layer opening.

7. A compound semiconductor device according to claim 6 wherein said first semiconductor layer is doped more heavily than said second semiconductor layer and said third semiconductor layer is doped more heavily than said first semiconductor layer.

8. A compound semiconductor device comprising a semiconductor multilayered structure, said semiconductor multilayered structure comprising;

a buffer layer formed directly on a semi-insulating substrate;

a channel layer formed directly on said buffer layer;

a first semiconductor layer formed directly on said channel layer;

a first recess etch-stop layer formed on said first semiconductor layer, said first recess etch-stop layer comprising a first etch-stop layer opening;

a second semiconductor layer formed on said first recess etch-stop layer, said second semiconductor layer comprising a second semiconductor layer opening with sloped sidewalls;

a second recess etch-stop layer formed on said second semiconductor layer, said second recess etch-stop layer comprising a second etch-stop layer opening;

a third semiconductor layer formed on said second recess etch-stop layer, said third semiconductor layer comprising a third semiconductor layer opening with sloped sidewalls wherein said third semiconductor layer opening is wider than said second semiconductor layer opening; and a gate electrode electrically contacted with said second semiconductor layer at said second semiconductor layer opening and wherein said gate electrode is not in contact with said third semiconductor layer.

* * * * *

UNITED STATES PATENT AND TRADEMARK OFFICE
CERTIFICATE OF CORRECTION

PATENT NO. : 6,180,968 B1
DATED : January 30, 2001
INVENTOR(S) : Kensuke Kasahara, Ohno, Yasuo, Ohkubo, Satoru Page 1 of 1

It is certified that error appears in the above-identified patent and that said Letters Patent is hereby corrected as shown below:

<u>Column 6,</u>
Line 29, before "direction" insert -- [011] --

Signed and Sealed this

Twelfth Day of February, 2002

Attest:

Attesting Officer

JAMES E. ROGAN
*Director of the United States Patent and Trademark Office*